United States Patent [19]

Yamamoto et al.

[11] Patent Number: 5,013,689

[45] Date of Patent: May 7, 1991

[54] METHOD OF FORMING A PASSIVATION FILM

[75] Inventors: Isamu Yamamoto; Jiro Fukushima, both of Hyogo, Japan

[73] Assignee: Mitsubishi Denki Kabushiki Kaisha, Tokyo, Japan

[21] Appl. No.: 467,325

[22] Filed: Jan. 18, 1990

Related U.S. Application Data

[63] Continuation of Ser. No. 158,055, Feb. 12, 1988, abandoned, which is a continuation of Ser. No. 869,204, May 30, 1986, abandoned.

[30] Foreign Application Priority Data

Aug. 14, 1985 [JP] Japan .................................. 60-179010

[51] Int. Cl.$^5$ .......................................... H01L 21/312
[52] U.S. Cl. .................... 437/229; 437/978; 148/DIG. 137
[58] Field of Search .............. 437/229, 978; 148/DIG. 137

[56] References Cited

U.S. PATENT DOCUMENTS

| | | | |
|---|---|---|---|
| 4,011,143 | 3/1977 | Del Monte et al. | 204/15 |
| 4,078,096 | 3/1978 | Redmond et al. | 427/98 |
| 4,167,413 | 9/1979 | Christ et al. | 427/96 X |
| 4,184,909 | 1/1980 | Chang et al. | 156/643 |
| 4,328,262 | 5/1982 | Kurahashi et al. | 427/93 |
| 4,357,203 | 11/1982 | Zelez | 156/643 |
| 4,451,973 | 6/1984 | Tateno et al. | 29/588 |
| 4,487,652 | 12/1984 | Almgren | 156/643 |
| 4,495,220 | 1/1985 | Wolf et al. | 427/82 |
| 4,523,372 | 6/1985 | Balda et al. | 29/590 |
| 4,604,294 | 8/1986 | Tanaka et al. | 427/53.1 |
| 4,654,223 | 3/1987 | Araps et al. | 437/247 |
| 4,670,497 | 6/1987 | Lee | 437/250 |

FOREIGN PATENT DOCUMENTS

| | | |
|---|---|---|
| A-0021818 | 1/1981 | European Pat. Off. . |
| A-0026967 | 4/1981 | European Pat. Off. . |
| A-0122631 | 10/1984 | European Pat. Off. . |
| 53-68163 | 6/1978 | Japan .................................. 437/226 |
| A-55-150259 | 11/1980 | Japan . |
| A-56-27936 | 3/1981 | Japan . |

OTHER PUBLICATIONS

Electronics International, vol. 54, No. 12, 16th Jun. 1981, p. 73, New York, U.S.; J. Gosch: "Polymer Doubles as Photoresist and Insulator".

Primary Examiner—Olik Chaudhuri
Assistant Examiner—Andrew Griffis
Attorney, Agent, or Firm—Wolf, Greenfield & Sacks

[57] ABSTRACT

A method of forming a passivation film for protection of circuits and/or curcuit elements on semiconductor chips, IC chips, LSI chips, VLSI chips or microcomputer, wherein the resist film used in patterning the passivation film is employed as part of the passivation film after being subjected to post-baking, and the upper layer of the passivation film is made of a material selected from the group consisting of a light-sensitive polyimide, silicon resin, epoxy resin and silicon ladder polymer.

8 Claims, No Drawings

METHOD OF FORMING A PASSIVATION FILM

This application is a continuation of application Ser. No. 07/158,055, filed Feb. 12, 1988, which in turn is a continuation of application Ser. No. 06/869,204, filed on May 30, 1986, both now abandoned.

BACKGROUND OF THE INVENTION

The present invention relates to a method of forming passivation films which serve to protect circuits and/or circuit elements on semiconductors and IC (integrated circuit) chip surfaces. In particular, the present invention relates to a method of forming films that feature extremely high levels of reliability and production rate and which are suitable for use as passivation films on high-integration chips incorporated in LSIs (large-scale integrated circuits), VLSIs (very large-scale integrated circuits) and microcomputers.

In the fabrication of semiconductor devices, in particular resin-molded semiconductor devices, inorganic passivating films are deposited to protect circuits on semiconductor chip surfaces from handling and contamination during processing. Such passivating films are typically made of phosphosilicate glasses (PSG) or silicon nitride ($Si_3N_4$) in single layers or in two stacked layers of PSG and $Si_3N_4$.

In conventional IC fabrication, a prepared wafer provided with the necessary circuit or circuit elements on the surface is subsequently protected by a thin passivating film which is formed of PSG or $Si_3N_4$ or a laminate thereof by sputtering or other suitable film-deposition techniques. In these cases, the bonding pads which should not be covered would also be covered with the passivating film. Therefore, in order to open windows in the areas corresponding to the bonding pads, a photoresist is applied to the same wafer, which, after pre-baking, is positioned on an aligner and the areas above the windows are exposed to ultraviolet radiation (if the resist is positive-working) to make them more soluble than unexposed areas. Thereafter, the resist on the windows is solubilized and stripped by an etching solution and the thin PSG or $Si_3N_4$ film is removed by dry plasma etching. In addition, the resist remaining in the areas other than those on the windows is solubilized and stripped by a rinse solution, forming the desired inorganic passivation film, such as PSG and/or $Si_3N_4$.

But, the integrity of the so formed passivation film is not complete in the strict sense of the term because upon closer examination it has pinholes and/or microcracks at stepped portions. In order to increase its reliability, the passivation film is usually covered with an organic thin film. However, if this is done by spin coating as a step in wafer preparation, windows must also be opened in the areas corresponding to bonding pads and procedures which are essentially the same as those employed after the formation of the inorganic passivating film must be repeated: application of a polyimide (PI), silicone or epoxy varnish by spin coating; baking; application of a photoresist (by spin coating) and pre-baking; setting on an aligner for aligning purposes; and exposure to ultraviolet radiation (in the areas on the windows such as for bonding pads if the photoresist is positive-working) so as to make the selected areas more soluble than the other areas. Subsequently, the unwanted areas of the photoresist are solubilized and stripped by an etching solution. The etchant also serves to open windows in the overlying organic passivation film made of PI or silicone or epoxy varnish. The remaining resist film is solubilized and removed by a rinse solution, then the organic passivation film forming the desired overcoat is subjected to post-baking until it hardens completely. These procedures complete the formation of the overall passivating film.

Being formed by the method described above, the conventional passivating film has pinholes and microcracks at stepped portions. In addition, the thin inorganic passivation film is so brittle that cracks will easily develop upon receiving mechanical shock during assembly of parts or mechanical or thermal stresses during packaging with molding resins. This has been one of the major causes of lowered reliability of the final product.

As already mentioned, the reliability of the thin inorganic passivation film can be increased by protecting it with an organic thin film which is made from PI, silicone, epoxy or silicone ladder polymer by spin coating, screen printing, potting or any other suitable techniques. However, these approaches still involve such complicated and numerous steps that not only huge capital investment is required but a considerable drop also occurs in the production rate. In addition, the chance of wafer or chip damage during materials handling or dirt or dust buildup or subsequent fouling

SUMMARY OF THE INVENTION

The present invention has been accomplished in order to eliminate the aforementioned problems of the prior art techniques and the primary object of the invention is to provide an efficient and cost-effective method of forming a passivation film which has such a high level of reliability that it can be satisfactorily employed in the fabrication of LSIs and VLSIs by application of most modern micromachining technology.

In accordance with the method of the present invention, the resist film which is used in patterning is post-baked to make it suitable for use as part of the intended passivating film. By so doing, a strong passivation film is formed and not only is the process of its formation simplified to provide higher productivity but also the reliability of the passivation film is improved.

DETAILED DESCRIPTION OF THE INVENTION

The major advantages of the method of the present invention are that it solves all the problems of the prior art methods of forming a passivation film and that the passivating film formed by this method is comparable to that of the film protected by a thin organic overcoat. According to the most basic feature of the method of the present invention, the resist film which is used for patterning purposes is left intact and is post-baked to render it suitable for use as part of the intended passivating film. This method solves all of the problems encountered in the prior art techniques, such as low productivity and poor reliability and yields due to wafer or chip damage or subsequent fouling of the device. In addition, the running cost and capital investment which are necessary for implementing the method are very low.

If conventional photoresists are used in the present invention, they are preferably post-baked after opening of windows so as to provide resist films having improved heat resistance, moisture resistance and mechanical properties. Materials which may be used with particular advantage instead of the conventional resist materials are those which can be patterned and which have such desirable properties as high resistance to heat and moisture, good mechanical properties, high purity and good adhesion to wafers, chips and molding resins Examples of such preferable materials are light-sensitive PI, silicone resins, epoxy resins and silicone ladder polymers.

The passivation film formed by the method of the present invention may be coated thereon with a variety of thin organic films as in the prior art techniques. In order to fabricate a resin-molded semiconductor device having increased reliability, the windows on bonding pads are commonly closed by potting the device with an organic material such as a silicone resin after wire bonding. The superiority of the present invention in terms of productivity and cost will not be lost even if it is applied to the fabrication of such resin-molded semiconductor devices because the method does not involve any step of stripping the initially applied resist film.

EXAMPLES

The advantages of the present invention will become more apparent by reading the following examples and comparative examples in conjunction with Table 1 which shows the results of evaluation of resistance to moisture and heat cycling with respect to the passivation films formed by the method of the present invention and those formed by conventional techniques.

In Examples 1 to 3, a number of passivation films containing the lower $Si_3N_4$ layer were formed by performing all the steps (including the final post-baking) in the method of the present invention using a positive-acting resist, OFPR-800 (product of Tokyo Ohka Kogyo Co., Ltd.; Example 1), or light-sensitive PI (Example 2) or a light-sensitive silicone ladder polymer (Example 3). The so formed passivation films were applied to 64 K (D) RAM memory chips, from which resin-molded semiconductor devices were fabricated. The moisture resistance of the devices was evaluated in a pressure cooker test (PCT) which was conducted at 121° C., 2 atm. pressures and 100% R.H. The devices were also subjected to a heat cycling test wherein one cycle consisted of cooling at $-65°$ C.$\times$30 minutes and heating at 150° C.$\times$30 minutes.

In Comparative Example 1, a 64 K (D) RAM memory chip having a $Si_3N_4$ passivation film was prepared using a conventional photoresist. The passivation film had windows opened for bonding pads. In Comparative Example 2, the chip of Comparative Example 1 was mounted on a lead frame, wirebonded, potted with a silicone resin and overlaid with a thin silicone film having a thickness of about 10 μm. Both chips were molded in a resin which was of the same type as used in the fabrication of semiconductor devices in Examples 1 to 3. The so molded semiconductor devices were subjected to tests for evaluating their resistance to moisture and heat cycling as in Examples 1 to 3.

TABLE 1

| Run No. | Moisture resistance Failure rate (%) after 3,000 hours (n = 100) | Resistance to heat cycling Failure rate (%) after 2,000 cycles (n = 200) |
| --- | --- | --- |
| Example 1 | 11 | 2 |
| Example 2 | 2 | 1 |
| Example 3 | 6 | 7 |
| Comparative Example 1 | 57 | 19 |
| Comparative Example 2 | 28 | 63 |

TABLE 1-continued

| Run No. | Moisture resistance Failure rate (%) after 3,000 hours (n = 100) | Resistance to heat cycling Failure rate (%) after 2,000 cycles (n = 200) |
| --- | --- | --- |
| Example 2 | | |

Table 1 shows that the semiconductor devices fabricated by employing the method of the present invention for forming a passivation film had much better resistance to moisture and heat cycling than the products obtained by using the conventional techniques. It is obvious that the present invention contributes to the streamlining of the overall process of fabricating semiconductor devices, thereby attaining the advantages of higher productivity, lower cost, faster access and lower capital investment.

The materials that can be used in the present invention are in no sense limited to those employed in Examples 1 to 3 and it should be understood that even fully inorganic materials may be used to long as they fit the process and object of the present invention.

As described in the foregoing pages, the resist film formed in the method of the present invention for patterning purposes is post-baked to acquire sufficient strength to become suitable for use as part of the intended passivation film. This is effective in simplifying the step of forming a passivation film and the resulting passivation film has the advantage of increased reliability.

We claim:

1. A method of forming a two-layer passivation film on a surface of a semiconductor chip which carries electrical elements consisting essentially of the following steps:
   A. forming a first passivation layer selected from the group consisting of phosphosilicate glass and silicon nitride on said chip surface,
   B. forming an organic resist layer on said first passivation layer formed of a material selected to be capable of acting as a passivation layer,
   C. forming windows in said resist layer to expose said first passivation layer, and
   D. selectively removing said first passivation layer through said windows and leaving said resist layer on the remainder of said semiconductor chip whereby said resist layer forms a primary passivation layer to complete said two-layer passivation film without the need for further processing.

2. A method of forming a two-layer passivation film according to claim 1 wherein step C comprises the steps of:
   C1. exposing said resist layer is selected patterns to form window areas, and
   C2. developing said resist layer to remove said resist layer in said window areas.

3. A method for forming a two-layer passivation film according to claim 1 wherein step D comprises the step of:
   D1. etching said first passivation layer through said windows.

4. A method for forming a two-layer passivation film according to claim 1 wherein said resist layer is selected from the group consisting of polymide, silicone resin, epoxy resin and silicone ladder polymers.

5. A method for forming a two-layer passivation film according to claim 4 wherein said resist layer is light-sensitive.

6. A method for forming a two-layer passivation film on the surface of a semiconductor chip consisting essentially of the following steps:
   A. forming a first passivation layer selected from the group consisting of phosphosilicate glass and silicon nitride on said surface of said chip,
   B. forming an organic resist layer on said first passivation layer formed of a material selected to be capable of acting as a passivation layer without the need for further processing,
   C. exposing and developing said resist layer to remove said resist layer in selected window areas, and
   D. selectively etching said first passivation layer through said windows to remove said first passivation layer in said window areas and leave said resist layer on the remainder of said semiconductor chip whereby said resist layer forms a primary passivation layer and completes said passivation film without further disrupting said resist layer and without the need for further processing.

7. A method for forming a two-layer passivation film according to claim 6 wherein said resist layer is selected from the group consisting of polymide, silicone resin, epoxy resin and silicone ladder polymers.

8. A method for forming a two layer passivation film according to claim 7 wherein said resist layer is light-sensitive.

* * * * *